(12) United States Patent
Gresham

(10) Patent No.: US 7,062,005 B2
(45) Date of Patent: Jun. 13, 2006

(54) MASTER SLAVE FRAME LOCK METHOD

(75) Inventor: Paul Gresham, Arnprior (CA)

(73) Assignee: Mitel Knowledge Corporation, Kanata (CA)

( * ) Notice: Subject to any disclaimer, the term of this patent is extended or adjusted under 35 U.S.C. 154(b) by 844 days.

(21) Appl. No.: 10/142,854

(22) Filed: May 9, 2002

(65) Prior Publication Data

US 2003/0001633 A1    Jan. 2, 2003

(30) Foreign Application Priority Data

May 9, 2001   (GB)   ............................... 0111300.0

(51) Int. Cl.
*H04L 7/00*   (2006.01)
*H03H 11/16*   (2006.01)

(52) U.S. Cl. .................... 375/375; 327/113; 327/236; 331/25

(58) Field of Classification Search ............... 375/356, 375/371, 373, 375; 327/113, 147, 153, 156, 327/161, 236; 331/25
See application file for complete search history.

(56) References Cited

U.S. PATENT DOCUMENTS

| | | | |
|---|---|---|---|
| 4,791,386 A | 12/1988 | Shiga | |
| 5,896,428 A | 4/1999 | Yanagiuchi | ................. 375/374 |
| 5,964,880 A * | 10/1999 | Liu et al. | .................... 713/401 |
| 6,088,255 A | 7/2000 | Matsuzaki et al. | ............ 365/76 |
| 6,987,823 B1 * | 1/2006 | Stark et al. | ................. 375/354 |

FOREIGN PATENT DOCUMENTS

| | | |
|---|---|---|
| CA | 1080310 | 6/1980 |
| EP | 0 156 375 A2 | 10/1985 |
| EP | 0 692 890 A1 | 1/1996 |
| WO | WO0106696 | 1/2001 |

* cited by examiner

*Primary Examiner*—Young T. Tse
(74) *Attorney, Agent, or Firm*—F. Chau & Associates, LLC (57) ABSTRACT

The present invention relates to a system for synchronising slave and master timing, comprising a phase adjust circuit for receiving and delaying an arbitrary clock signal by an adjustable amount and outputting a delayed clock signal related to the slave timing, and a master phase detector and lock circuit for comparing relative phases of the master and slave timing and in response generating and applying delay adjust signals to the phase adjust circuit at a dynamically adjusted rate which is related to the relative phase in order to synchronise the slave and master timing and is thereafter reduced to a minimum rate required to maintain synchronisation of the slave and master timing.

18 Claims, 4 Drawing Sheets

Slave Synchronization Block Diagram

Figure 1
Slave Synchronization Block Diagram

MASTER SLAVE FRAME LOCK METHOD

FIELD OF THE INVENTION

The present invention relates in general to network systems and more specifically to a method and apparatus for synchronizing a slave network to a master network via a communication link there between.

BACKGROUND OF THE INVENTION

It is known in the art for slave network nodes to perform direct clock and framing extraction on the input data stream from the master network re-create the corresponding clocking and frame reference signals on the slave network. One problem with this technique is that the clocking signals derived at the slave network tend to be subjected to jitter, as a result of having been extracted directly from the data stream, and therefore subject to the noise characteristics of the transmission line joining the master to the slave. This technique also requires that the exact framing of the master be present in some form in the data stream, usually as a start-of-frame character or signal. Also, the data stream from the master to the slave must be continuous. If there is an interruption in the data stream, the clocking and framing of the slave system is usually quite radically affected. Some systems incorporate loss-of-signal detectors and circuitry for maintaining the slave clocks approximately constant in the event of data interruption, until the data stream signal is re-established. Overall, this technique is not well suited to applications with stringent requirements on accuracy of the derived slave clock.

Phase locked loops (PLL) are well-known systems by which clocking and phasing are generated on the slave node using voltage-controlled oscillators. The initial framing of the slave is arbitrary. However, the slave node framing phase information is compared to the relative frame phasing received from the master node via the data link. An error-offset signal is calculated using the phase information from the master and the slave. The offset signal feeds back into the voltage controlled oscillator of the slave node clock generation circuits, to adjust the slave clock frequency until the master and the slave are in the desired relative phase. This frequency until the master and the slave are in the desired relative phase. This technique provides a very smooth operating slave end node that is quite resilient to transient noise characteristics on the data link. Brief interruptions in the signal are tolerated, without affecting the slave clock and framing.

The problem with prior art phase lock loops is that the circuit design is generally more complicated than direct-clock-extraction circuits. Phase lock loop circuits generally incorporate well known devices such as voltage controlled oscillators, phase comparators, etc. which cannot be easily integrated into digital CMOS ASICs. On the other hand, PLL circuits that are designed for integration into ASICs have fixed operational characteristics that are not desirable. For example, the frequency and/or phase tracking response is generally fixed. Some PLL circuits have dual or even multiple algorithms, (i.e. one for tracking the master phase and initially establishing the slave phase lock, and a different algorithm for keeping the slave circuit locked.) These circuits are usually employed because the criteria required to track the master phase and establish the slave phase under all possible conditions tend to make the slave signal unstable or jittery once the circuit is locked. Alternatively, circuits that are characterised by desirable clock quality and stability do not provide sufficient response to initially capture and lock to the master node under all conditions.

Finally, a PLL lock-holding response that provides the most desirable clock output characteristics tends to have longer time constants associated with it. Thus, for example, in the situation of a master system lock to a digital trunk (slave system), these long time constants in combination with the master tracking algorithm can cause system instability.

SUMMARY OF THE INVENTION

According to the present invention, a master/slave synchronisation technique is set forth which does not utilise a fixed locking algorithm or multiple fixed algorithms. Instead, the synchronisation system of the present invention is characterised by a piece-wise linear exponential response that is self-adjusting to the conditions of the data link, and to the current phase lock status of the slave node. The circuit of the present invention records the rate at which a locking signal is applied to the phase adjust circuit, and then dynamically adjusts this rate until it reaches a minimum value required to maintain lock under existing conditions. By adjusting the rate to a minimum value, the jittery characteristics of the output slave clock are minimised.

The master/slave phase lock technique of the present invention can also be integrated into the same CMOS digital ASIC as other data encode/decode and clock extraction circuits, without the need for any external hardware. According to a successful prototype, a single ASIC contains bit decoding hardware, slave framing hardware, and clock extraction hardware, as well as the master/slave synchronization hardware of the present invention. This substantially reduces the cost of the synchronisation function, and the required PCB area.

The circuit of the present invention is designed to function exclusively in a digital environment, unlike traditional prior art PLL circuits. All signalling is constant with "logic 1" and "logic 0" type logic levels consistent with the current digital CMOS design techniques.

BRIEF DESCRIPTION OF THE DETAILED DRAWINGS

A description of a preferred embodiment of the present invention is provided herein below with reference to the accompanying drawings in which.

DETAILED DESCRIPTION OF PREFERRED EMBODIMENTS

The master/slave phase lock circuit of the present invention operates with other components described in co-pending U.K. patent application no. 0004672.2, Canadian patent application no. 2,338,320 and U.S. patent application Ser. No. 09/794,644, now U.S. Pat. No. 6,795,514, entitled Integrated Data Clock Extractor, the contents of which are incorporated herein by reference. The circuit of the present invention makes use of the design of the programmable delay element described therein. This circuit according to the present invention also incorporates a frequency hold over circuit as disclosed in the foregoing application. The provision of a frequency hold over circuit has two significant effects. Firstly, it provides a stable, non-transient slave frequency in the event that the data stream signal from the master is interrupted. Secondly, it reduces the rate, referred to above, at which the locking signal must be applied to the phase adjust circuit in order to hold the slave locked to the master.

Figure 1:
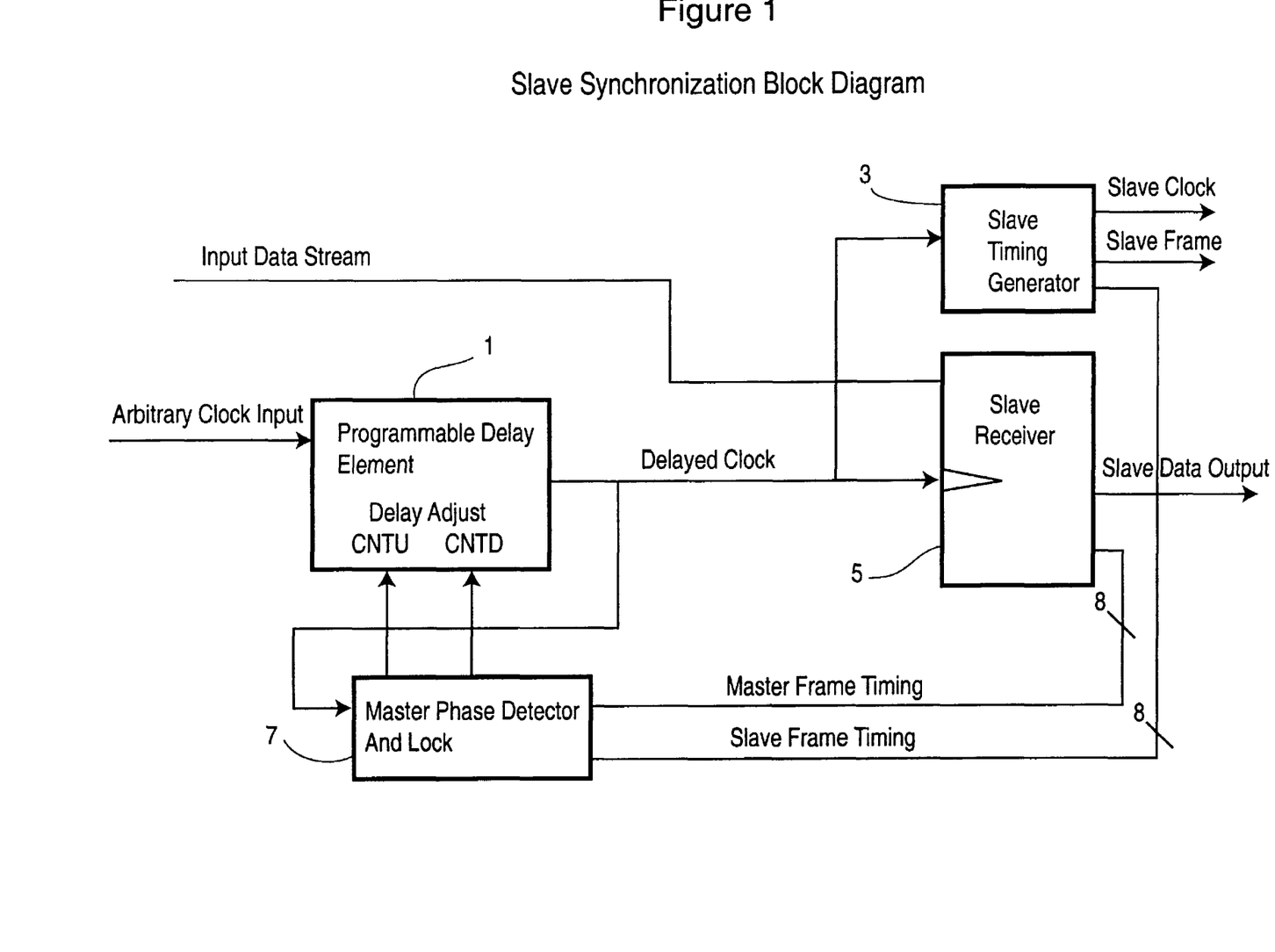
FIG. 1 is a block diagram of the master/slave synchronization system in accordance with a preferred embodiment of the present invention.

According to the present invention, a slave phase locking function is provided by applying a variable amount of delay to an arbitrary clock signal of predetermined frequency. As shown in FIG. 1, the arbitrary clock signal is delayed by a programmable delay element 1, as discussed in greater detail with reference to the aforementioned U.K. patent application no. 0004672.2, Canadian patent application no. 2,338,320 and U.S. patent application Ser. No. 09/794,644, now U.S. Pat. No. 6,795,514. The resulting delayed clock signal is used to run a slave timing generator 3, slave receiver 5 and master phase detector and lock 7. The arbitrary clock input signal can be generated using any number of well known and well understood techniques. For example, most ASIC technology libraries offer crystal oscillator or phase-lock-loop macro cells that may be used to generate the arbitrary clock signal. According to a successful prototype of the invention, an integrated crystal oscillator circuit was used.

The slave timing generator 3 is a circuit consisting primarily of synchronous counters, that are used to create a reference slave frame pulse signal, and a reference slave clock. Different types of frame formats may be used, and the specifications of the frame are not part of the present invention. According to the successful prototype, 125 micro second frames were divided into 256 timeslots, each timeslot being 488 nanoseconds long. The 8 bit Slave Frame Timing signal generated by slave timing generator 3 represents an 8 bit binary count of these timeslots, from 0 to 255, as they occur in time. For other frame types, the only requirement is that a binary count be provided from the timing circuit that is 0 at the start of the frame, and all 1's at the end of the frame. Someone skilled in the art can easily produce this type of hardware. When power is first applied, this count, and the corresponding slave frame reference, is set arbitrarily.

The receiver 5 receives the data stream and decodes the master timing from it. Again, numerous types of data formats are possible. In the successful prototype, this data stream was a 20.48 mega bit/second serial link, with 256 timeslots, of 10 bit data. A special 10 bit code was incorporated in this data stream to mark the frame boundaries, and the data clock was encoded into the bit stream. An array of decade and binary counters were used to produce another 8 bit signal, the Master Frame Timing, that ranges from 0 at the start of the incoming frame, to 255 at the end of the incoming frame. Again, anyone skilled in the art would be capable of producing hardware of this nature.

The programmable delay element 1 illustrated in FIG. 1 is essentially identical to that described in co-pending U.K. patent application no. 0004672.2, Canadian patent application no. 2,338,320 and U.S. patent application Ser. No. 09/794,644, now U.S. Pat. No. 6,795,514, entitled Integrated Data Clock Extractor. The delay element 1 included a 64 element delay line, cycle limit extractors, clock reverters, two clock MUXs, glitch removers, and portions of a clock phase detector that include the delay FIFO, re-synch latch and synchronous up/down counter as set forth in the above-identified co-pending application.

The delay adjust signal input of element 1 receives two signals, CNTU and CNTD, that feed the above-mentioned synchronous up/down counter. If CNTU is active for one clock, then the programmable delay 1 adds one quanta of delay to the output clock, and if CNTD is active for one clock, then the programmable delay 1 subtracts one quanta of delay from the output clock. A person of ordinary skill in the art, referencing the aforementioned co-pending U.K. patent application no. 0004672.2, Canadian patent application no. 2,338,320 and U.S. patent application Ser. No. 09/794,644, now U.S. Pat. No. 6,795,514, would be capable of producing this circuit.

The master phase detector and lock circuit 7 compares the master frame timing from the input data stream with the slave frame timing from the salve timing generator 3. The CNTU and CNTD signals are then applied to the programmable delay element 1 to makes small incremental changes to the delay of the clock feeding the slave timing generator 3 and the receive circuit 5, until the desired slave phase is achieved. The rate at which these two signals are applied to the programmable delay elements determines the locking characteristics of the circuit.

The master phase detector and lock circuit 7 compares the master timing from the input data stream with the slave timing from the slave timing generator 3. The CNTU and CNTD signals are then applied to the programmable delay element 1 to make small incremental changes to the delay of the clock feeding the slave timing generator 3 and the receive circuit 5, until the desired slave phase is achieved. The rate at which these two signals are applied to the programmable delay elements determines the locking characteristics of the circuit.

Figure 2A:
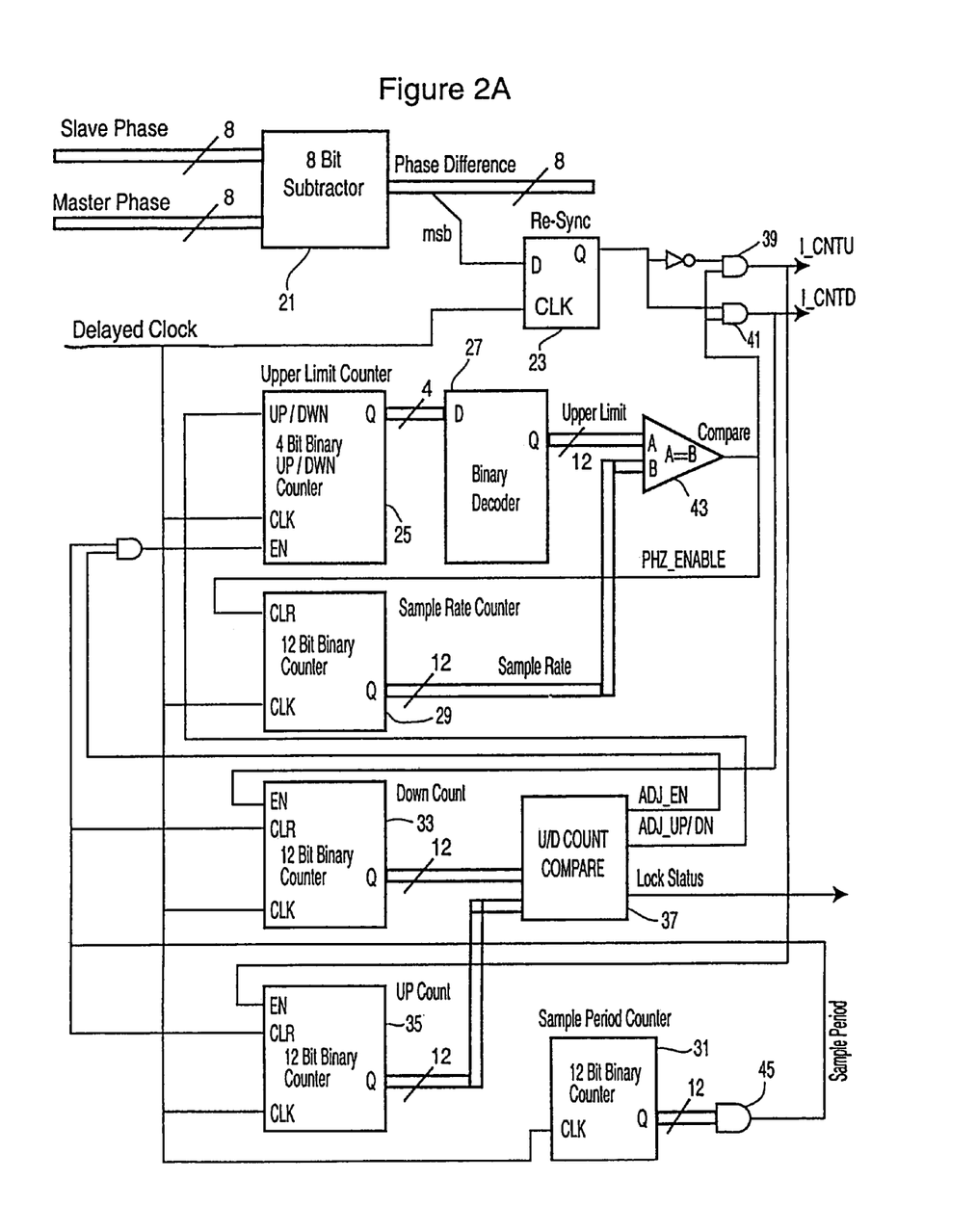
FIGS. 2A and 2B, in combination, form a block schematic diagram of a master phase detector and lock circuit of FIG. 1.
Figure 2B:
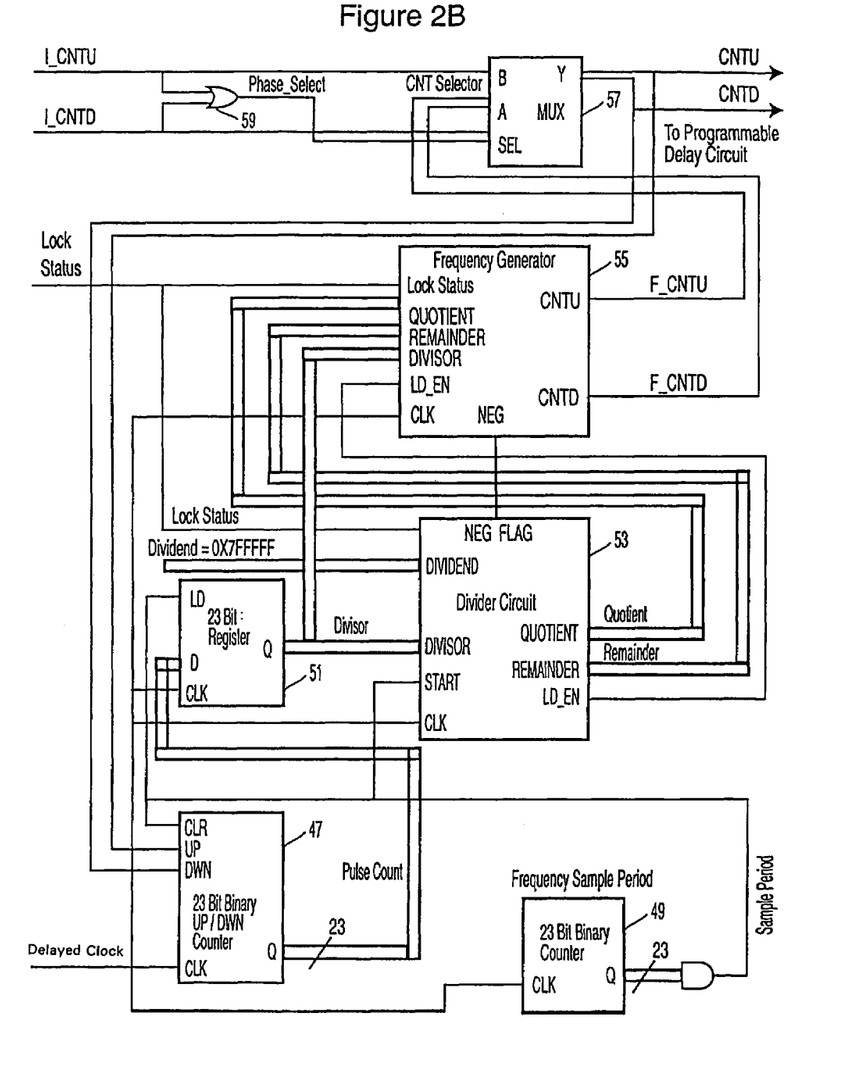

A block diagram of the master phase detector and lock circuit 7 is provided in FIGS. 2A and 2B. As shown in FIG. 2A, master phase detector and lock circuit 7 includes a combinatorial 8 bit subtractor 21, a re-sync flip-flop 23, a synchronous 4 bit binary UP/DWN counter 25, a 4 to 12 bit binary decoder 27, 12 bit synchronous sample rate counter 29, another 12 bit synchronous sample period counter 31, two 12 bit synchronous up and down counters with enable and clear 33 and 35, and an U/D COUNT COMPARE 37. A frequency generator and hold-over portion of the master phase detector and lock circuit 7 is illustrated in FIG. 2B, discussed in greater detail below.

The subtractor 21 is an 8 bit binary subtractor of standard design which forms the heart of the master/slave phase comparator. If the slave lags the master in time, then the slave phase is greater than the master phase, and a subtraction of the two phase numbers (i.e. 8 bit slave phase minus 8 bit master phase) yields a negative 8 bit phase difference number. Consequently, the msb (most significant bit) of the phase difference is set. If the slave phase is ahead of the master phase in time, then the slave phase number is less than the Master Phase number, and a subtraction of the two phase numbers (i.e. 8 bit slave phase minus 8 bit master phase) yields a positive phase difference number. When this happens, the msb of the phase difference result is cleared.

The re-sync flip-flop 23 re-times the msb signal to give an unambiguous signal to the inputs of AND gates 39 and 41 that are used to create the I_CNTU and I_CNTD outputs to the programmable delay element 1. As discussed further below, the I_CNTU and I_CNTD signals do not directly feed into the programmable delay element 1, but rather feed into the frequency generator and hold over circuit of FIG. 2B and are transmitted therefrom to the programmable delay element.

A PHZ_ENABLE signal is generated, as discussed in greater detail below, and applied to AND gates 39 and 41 to periodically gate one of the I_CNTU or I_CNTD signals, depending on the state of the msb signal.

If the msb signal output from re-sync flip flop 23 is set, indicating that the slave is lagging the master in time, then the I_CNTD signal is generated. This causes one quanta of time to be removed from the slave phase, thereby advancing the slave in time and slightly reducing the phase difference. If the msb signal output from the re-sync flip flop 23 is reset, indicating that the slave is leading the master in time, then the I_CNTU signal is generated. This causes one quanta of time to be added to the slave phase, thereby retreating the slave in time and slightly reducing the phase difference. At some point, when the master and the slave are almost exactly in phase, the msb signal on the output of the re-sync flip flop 23 begins to alternate with every application of the PHZ_ENABLE signal. This, in turn, causes the assertions of I_CNTD and I_CNTU to alternate, signifying the point in time where the master and the slave are locked in phase.

The 4 bit binary UP/DWN counter 25 is a common well known structure except that it is configured for a count range between 0 and 11 (inclusive), and is configured not to count less than 0 or greater than 11. This may be expressed as follows using Verilog HDL:

```
always @(posedge CLK) if(EN) begin
  if(UP/DWN) Q <= (Q<11) ? Q+1 : Q);
  else Q <= (Q>0) ? Q-1 : Q)
end
```

The binary decoder 27 is also of common well known structure except that it is configured for a 4 bit binary input in the range 0 to 11 (inclusive). This may be expressed as follows using Verilog HDL:

```
always @(D) case(D)
  4'b0000: Q <= 12'b000000000001;
  4'b0001: Q <= 12'b000000000010;
  4'b0010: Q <= 12'b000000000100;
  4'b0011: Q <= 12'b000000001000;
  4'b0100: Q <= 12'b000000010000;
  4'b0101: Q <= 12'b000000100000;
  4'b0110: Q <= 12'b000001000000;
  4'b0111: Q <= 12'b000010000000;
  4'b1000: Q <= 12'b000100000000;
  4'b1001: Q <= 12'b001000000000;
  4'b1010: Q <= 12'b010000000000;
  4'b1011: Q <= 12'b100000000000;
  default: Q <= 12'b100000000000;
endcase
```

The 12 bit binary compare circuit 43 performs the following function, expressed in Verilog HDL:
 always @(A or B) Q<=(A==B);

Referring to FIG. 2A, the 12 bit upper limit output of the binary decoder 27 generates values of $2^{(n+1)}$, where n is the binary value of the 4 bit UP/DWN counter 25. The 12 bit sample rate counter 29 counts up to the value generated by decoder 27, performing one count for every clock of the slave clock. Both the sample rate and the upper limit values are compared continuously, and when they become equal the PHZ_ENABLE is activated. This signal is used to drive one of the outputs I_CNTU or I_CNTD, depending on the value of the msb signal on the output of the re-sync flip-flop 23. The I_CNTU and I_CNTD signals are used to control the programmable delay element 1, as shown in FIG. 1. The PHZ_ENABLE signal also clears the sample rate counter 29.

When the upper limit counter 25 has a binary value of zero, the PHZ_ENABLE signal is activated on every other phase of the slave clock. When the upper limit counter has a binary value of 1, the PHZ_ENABLE signal is activated every four slave clock cycles. When the upper limit counter has a binary value of 2, the PHZ_ENABLE signal is activated every eight slave clock cycles, and so on until the upper limit counter has a binary value of 11, in which case the PHZ_ENABLE signal is activated every 4096 slave clock cycles. Thus, for every count that the upper limit counter increases, the rate at which the I_CNTU and I_CNTD signals are applied to the programmable delay circuit 1 is halved. This gives the circuit an exponential response characteristic.

There are two 12 bit synchronous counters, the down counter 33, and the up counter 35. Both of these counters count the number of times that their respective count enable signals I_CNTU and I_CNTD respectively go active within a fixed period of time. The 12 bit sample period counter 31 measures out this period of time to 4096 slave clock cycles.

When the sample period counter 31 reaches its highest value, AND gate 45 generates a sample period pulse that is applied to the 4 bit synchronous UP/DWN counter 25. The counter 25 is incremented or decremented upon receipt of each sample period pulse, depending on the additional signalling it receives from the U/D count compare block 37. The sample period pulse also clears the down counter 33 and the up counter 35 for the next sample period.

The U/D count compare block 37 continuously examines the down counter 33 and the up counter 35 outputs, and appropriately signals the 4 bit UP/DWN counter 25 as to whether an increment or a decrement is required. This count, if required, occurs at the end of every sample period. The operation of the U/D count compare block 37 is expressed as follows:

if((Up Count<=5).vertline..vertline.(Down Count<=5))
  then decrement UP/DWN
else if((Up Count+Down Count)/2>abs(Up Count–Down Count)+5) then increment UP/DWN
else do not change UP/DWN As indicated above, the UP/DWN counter 25 is never decremented if its value is zero, and it is never incremented if its value is 11.

As shown in FIG. 2A, the U/D count compare block 37 also produces a lock status signal which is fed to the frequency generator and hold-over circuit discussed in greater detail below with reference to FIG. 2B. This signal is a logical 1 if the phase detector and lock circuit 7 is locked. This is indicated if both of the down counter 33 and the up counter 35 registers are non-zero.

During a complete sample period, if the slave is locked to the master then both of the down counter 33 and the up counter 35 values are non-zero. If either is zero, then the slave is not locked to the master. The 4 bit synchronous upper limit counter 25 is signalled by the U/D count compare block 37 to count down by one count if either of the down counter 33 or the up counter 35 is less than or equal to five. This action doubles the rate at which the I_CNTU or I_CNTD signals are sent to the programmable delay element 1.

After another sample period, the down counter 33 and the up counter 35 values are re-examined again. If either is zero, then the slave is still not locked to the master, and the 4 bit synchronous counter 25 is signalled to count down by one again. This continues until the 4 bit synchronous UP/DWN counter 25 has counted down to zero. At this point, the I_CNTU or I_CNTD signals are sent to the programmable delay element 1 at the maximum rate. This rate is predetermined to be about 10 times the rate actually needed by the slave to guarantee, under worst case conditions, that the slave phase will be able to 'catch' the master.

When the slave 'catches' the master, then the two 8 bit master and slave phase numbers becomes equal, and the I_CNTU and I_CNTD signals begin to alternate, as described above. This results in both the down counter 33 and the up counter 35 values being non-zero numbers at the end of the sample period. Also, if the UP/DWN counter 25 value is small, and the corresponding sample rate is high, the numerical values for both the up counter and down counter will be quite high.

If both down counter 33 and up counter 35 are greater than five, and if the numerical average of the up counter and the down counter is five or more than the absolute value of their difference, then the UP/DWN counter 25 is incremented by 1. Otherwise, no changes are made to the UP/DWN counter. Consequently, the value of the UP/DWN counter is adjusted so that both up counter and down counter are minimized without becoming zero.

The reason for comparing the down counter 33 and up counter 35 against the number five (5), and for comparing the average of their numerical output against 5 more than the difference, is that it is desirable to keep both the up counter and down counter numbers as small as possible (but greater than zero). The number five (5) was chosen to achieve this requirement.

The frequency hold-over circuit is illustrated in FIG. 2B. This circuit consists of a 23 bit UP/DWN pulse counter 47, a 23 bit frequency sample period counter 49, a 23 bit latch 51, a divider circuit 53, a frequency generator circuit 55, and a MUX 57.

As discussed above, the I_CNTU and the I_CNTD signals are received from the phase detector and lock circuit shown in FIG. 2A. These signals are OR-ed together by OR gate 59 and used to control the CNT Selector MUX 57. The CNT selector MUX is used to select the source of the two CNTU and CNTD signals that are applied to the programmable delay circuit 1, as shown in FIG. 1. If both of I_CNTD and I_CNTU are logic 0, then the signals F_CNTD and F_CNTU are selected as the CNDU and CNTD outputs, respectively. If either of I_CNTU or I_CNTD are a logic 1, then the I_CNTU and the I_CNTD signals are selected as the CNDU and CNTD outputs, respectively.

The 23 bit counter 47 is used to mark a fixed time interval during which to monitor the output signals CNTU and CNTD. For each clock cycle that CNTU is active, the UP/DWN counter 47 counts up by 1. For each clock cycle that CNTD is active, the UP/DWN counter 47 counts down by 1. At the end of the time interval, the value in the UP/DWN 47 counter is transferred to the 23 bit latch 51, and the cycle is repeated. This number is the integer difference between the number of CNTU signals and the number of CNTD signals that has occurred during the time interval. This difference is applied to the 23 bit divider circuit 53 as a divisor.

The 23 bit unsigned constant 0x7FFFFF, or all bits set, is applied as a dividend to the divider circuit 53. This results in the dividend being set to the maximal count value that the interval timer can achieve. The divider circuit 53 uses a fairly well known technique of successive subtraction to perform long division of the divisor into the dividend. A quick summary of this technique is as follows:

Latch dividend into register; clear quotient register. Clear the shift count register.

If divisor is 0, then exit.

If divisor is negative (most significant bit is set) then negate and set NEG FLAG.

Shift divisor left until msb is set; For each shift, increment the shift count register.

While (shift count>=0) if (dividend-divisor is positive) then set the quotient register bit number indicated by shift count, and set dividend to (dividend-divisor). Decrement the shift count and shift the divisor right 1 bit position.

When the shift count becomes less than 0, then store the remaining dividend into the remainder register. The quotient register will contain the quotient.

The divider circuit 53 also has a LD_EN output. The signal from this output is an output pulse gated on the state machine which implements the division operation and is used to indicate when the divider circuit has completed the division operation. As an example, the final pulse used to enable the loading of the remainder register could be used for this function.

A person of ordinary skill in the art will understand how to construct and implement hardware for the divider circuit 53. Alternatively, hardware synthesizers such as Synopsys Behavioral Compiler can be used to synthesize this type of structure.

Not withstanding the foregoing, if a logic zero is received on the lock status input of divider 53, then no calculation is performed, and no changes are made to the current values of the remainder and the quotient, and no LD_EN output pulse is generated.

The frequency generator module 55 takes the quotient, divisor, remainder, and the negative flag, and uses these to generate a regularly timed series of pulses, F_CNTU or F_CNTD, that are applied to the programmable delay element 1, in order to provide a steady frequency component. However, if a logic zero is received on the lock status input, then no changes are made to the rate at which F_CNTU or F_CNTD are generated. Also, if a zero divisor is detected then no pulses are generated at the F_CNTU or F_CNTD outputs.

The block diagram for the frequency generator module 55 is illustrated FIG. 4. The main components are the magnitude compare 61, the equality compare 63, the 23 bit counter 65, and the 23 bit accumulator 67, and the 23 bit counter 65.

Figure 3:
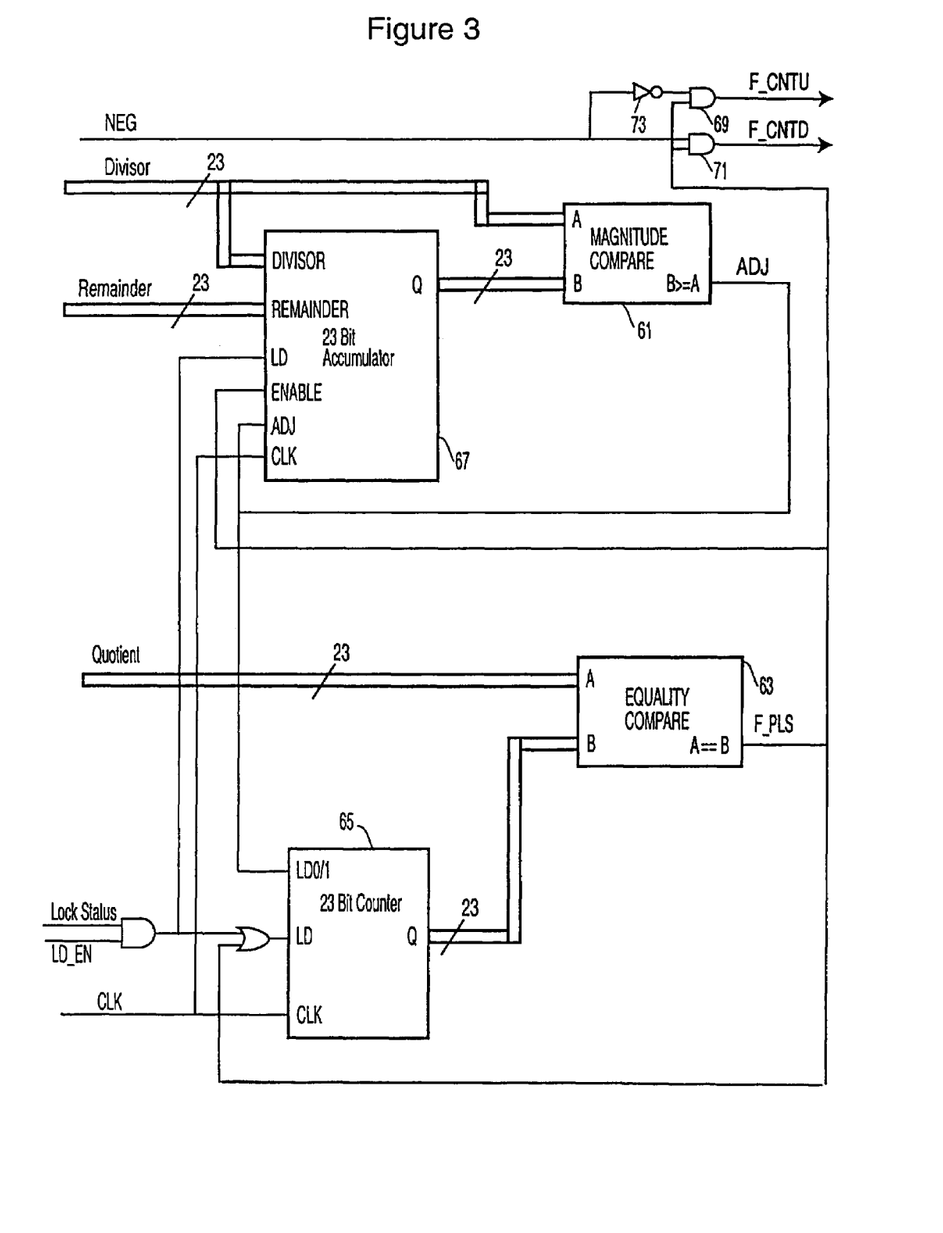
FIG. 3 is a block schematic diagram of a frequency generator portion of a master phase detector and lock circuit of FIG. 1.

The counter 65 is a synchronous counter of well known characteristics. For every clock cycle, if the LD input is low, it performs a synchronous up count. Its output, Q, is compared continuously with the 23 bit quotient by the equality compare circuit 63. When the quotient becomes equal to the output of the 23 bit counter 65, a F_PLS signal is generated by the equality compare circuit, and fed back to the LD input of the 23 bit counter 65. For each transition of the CLK input signal with the LD input high, the counter 65 is pre-loaded with a logic 1 if the LD0/1 input is low or with a logic 0 if the LD0/1 input is high. The operation of the 23 bit counter may be expressed as follows (Verilog HDL):

always @(posedge CLK) if(LD) Q<=LD0/1 ? 23'h0: 23'h1;

else Q<=Q+1;

The F_PLS signal is also fed into the enable input of 23 bit accumulator 67, which is designed to keep a running sum of the remainder input. In other words, when the enable signal goes high, the amount of the remainder is added to the current value of the accumulator output, Q. The magnitude compare circuit 61 continuously monitors the output of the 23 bit accumulator, Q, and compares it to the value on the divisor input. If the output of the 23 bit accumulator 67 becomes greater than or equal to the value on the divisor input, then the ADJ signal is driven high.

The 23 bit accumulator 67 modifies its action if the ADJ input goes high. When the ADJ input is high, then the amount of the remainder is added to the accumulator output, Q, and the amount of the divisor is subtracted from the accumulator output, Q.

The LD input to the 23 bit accumulator 67 is used to load the initial value of the remainder into the accumulator at the start of a frequency sample period, after the divider circuit has completed the division operation.

The operation of the 23 bit accumulator 67 may be concisely described as follows (Verilog HDL):

```
always@(posedge CLK)
if(LD) Q <= REMAINDER;
else begin
    if(ENABLE) Q <= ADJ ? Q + REMAINDER – DIVISOR : Q +
    REMAINDER;
end
```

Both the equality compare circuit 63 and the magnitude compare circuit 61 are not illustrated in detail because they are trivial components that are common and well known in operation, as would be understood by a person of ordinary skill in the art.

The arrangement of the 23 bit counter 65 and the 23 bit accumulator 67 provides a pulse rate at the F_PLS signal whose period is proportional to the value of the quotient. Also, when the 23 bit accumulator provides the ADJ pulse to the 23 bit accumulator 67, then the counter pre-loads a zero instead of a one. This results in the counter counting one more CLK pulse than during the previous period. Together, this arrangement spreads the effect of the remainder over the entire frequency sample period, and provides a more accurate distribution of F_CNTU or F_CNTD signals.

The LD_EN signal is provided by the divider module 53 as shown in FIG. 2B. This signal is gated with the lock status input to prevent the circuit from changing its operation if lock status is removed. The frequency generator circuit of FIG. 3 does not show gating circuitry for disabling the generation of the F_PLS signal if the value of the divisor is zero. However, this is a trivial component that need not be illustrated, thereby preserving the clarity of FIG. 3.

The F_PLS signal is combined with the NEG input through AND gates 69 and 71 and the INVERTER 73 to produce the output signals F_CNTU and F_CNTD. If the F_PLS signal is pulsed, and the NEG signal is high, then the F_CNTD signal is activated. If the F_PLS signal is pulsed, and the NEG signal is low, then the F_CNTU signal is activated.

The main functionality of the frequency generator and hold-over circuit of FIGS. 2B and 3 is to count the net number of CNTU or CNTD signals applied to the programmable delay circuit 1 over a large period of time while the phase detector and lock circuit of FIG. 2A is locked in phase, and then to calculate the steady-state rate at which these signals must be applied to the programmable delay circuit 1 in order to achieve the same net count.

It can be shown that when the frequency generator and hold-over circuit applies these pulses, then the values calculated for the up count 35 and down count 33 in the phase detector and lock circuit of FIG. 2A will cease to include this component in their respective counts, and will therefore become more equal to each other. When this happens, the up down compare circuit 37 allows the UP/DWN counter 25 to count up to a higher value, thus reducing the rate at which the I_CNTU and I_CNTD signals are generated while still maintaining the lock status. This in turn leads to a less jittery output signal.

A person understanding the present invention may conceive of alternative embodiments and applications thereof. For example, the frequency sample period generated by counter 49 in FIG. 2B and the sample period counter 31 in FIG. 2A, and their respective circuits may have counter widths adjusted to vary some of the operational characteristics. The compare value of five (5), discussed above, can also be adjusted to vary the operational characteristics. Other applications of the invention include virtually any application where a slave node is connected to a master node using a communication link that contains within it, a timing reference to the master node, where: (1) the relative phase of the slave node with respect to the master node is important, (2) the signal quality of the reference clocks on the slave node is important, (3) the combined stability of the Master and slave together is important, and (4) the level of integration is important. All such changes and modifications may be made without departing from the sphere and scope of the invention as defined by the claims appended herein.

What is claimed is:

1. A system for synchronising slave and master timing, comprising:

a phase adjust circuit for receiving and delaying an arbitrary clock signal by an adjustable amount and outputting a delayed clock signal related to said slave timing; and a master phase detector and lock circuit for comparing relative phases of said master and slave timing and in response generating and applying delay adjust signals to said phase adjust circuit at a dynamically adjusted rate which is related to said relative phases in order to synchronise said slave and master timing and is thereafter reduced to a minimum rate required to maintain synchronisation of said slave and master timing;

wherein said master phase detector includes circuitry for generating said delay adjust signals in the form of up count signals for incrementally increasing said adjustable amount of delay in the event said slave timing leads said master timing, and down count signals for incrementally decreasing said adjustable amount of delay in the event said slave timing lags said master timing.

2. The system of claim 1, wherein said master phase detector and lock circuit further includes:

an upper limit counter for generating an upper limit count value which is related to said dynamically adjusted rate at which said delay adjust signals are applied to said phase adjust circuit by an inverse piece-wise linear exponential relationship;

an up counter for counting how many of said up count signals are generated within a predetermined sample period;

a down counter for counting how many of said down count signals are generated within said predetermined sample period; and a count compare circuit for generating an up/down signal which (i) decrements said upper limit counter in the event either of said up counter or down counter has counted to no greater than a predetermined number, thereby doubling said dynamically adjusted rate at which said delay adjust signals are applied to said phase adjust circuit, and (ii) increments said upper limit counter in the event that both said up counter and down counter have counted to greater than said predetermined number and the numerical average of said up counter and down counter exceeds the absolute value of their difference by at least said predetermined number, thereby halving said dynamically adjusted rate at which said delay adjust signals are applied to said phase adjust circuit.

3. The system according to claim 2, further comprising a frequency hold over circuit for calculating a steady-state rate at which said delay adjust signals are applied to said phase adjust circuit while maintaining said synchronisation of said slave and master timing and than applying said delay adjust signals to said phase adjust circuit at said steady-state rate.

4. The system of claim 2, wherein said predetermined number is chosen to minimize said up counter and down counter to count values greater than zero.

5. The system according to claim 4, further comprising a frequency hold over circuit for calculating a steady-state rate at which said delay adjust signals are applied to said phase adjust circuit while maintaining said synchronisation of said slave and master timing and than applying said delay adjust signals to said phase adjust circuit at said steady-state rate.

6. The system of claim 4, wherein said predetermined number is five.

7. The system according to claim 6, further comprising a frequency hold over circuit for calculating a steady-state rate at which said delay adjust signals are applied to said phase adjust circuit while maintaining said synchronisation of said slave and master timing and than applying said delay adjust signals to said phase adjust circuit at said steady-state rate.

8. The system according to claim 1, further comprising a frequency hold over circuit for calculating a steady-state rate at which said delay adjust signals are applied to said phase adjust circuit while maintaining said synchronisation of said slave and master timing and than applying said delay adjust signals to said phase adjust circuit at said steady-state rate.

9. A method of synchronising slave and master timing, comprising:
delaying an arbitrary clock signal by an adjustable amount and outputting a delayed clock signal related to said slave timing;
comparing relative phases of said master and slave timing and in response generating delay adjust signals for decreasing said adjustable amount of delay in the event said slave timing lags said master timing and increasing said adjustable amount of delay in the event said slave timing leads said master timing; and
dynamically adjusting the rate at which said delay adjust signals are generated relative to said relative phases in order to synchronise said slave and master timing and thereafter reducing said rate to a value required to maintain synchronisation of said slave and master timing.

10. The method of claim 9, wherein said delay adjust signals are generated in the form of up count signals for incrementally increasing said adjustable amount of delay, and down count signals for incrementally decreasing said adjustable amount of delay.

11. The method according to claim 10, further comprising calculating a stead-state rate at which said delay adjust signals are generated while maintaining said synchronisation of said slave and master timing and then generating said delay adjust signals at said steady-state rate.

12. The method of claim 10, further comprising: generating an upper limit count value which is related to said dynamically adjusted rate at which said delay adjust signals are generated by an inverse piece-wise linear exponential relationship; counting the number of said up count signals generated within a predetermined sample period; counting the number of said down count signals generated within said predetermined sample period; and generating an up/down signal which (i) decrements said upper limit count value in the event either of said number of up count or down count signals is no greater than a predetermined number, thereby doubling said dynamically adjusted rate at which said delay adjust signals are generated, and (ii) increments said upper limit count value in the event that both said number of up count signals and said number of down count signals are greater than said predetermined number and the numerical average of said number of up count signals and said number of down count signals exceeds the absolute value of their difference by at least said predetermined number, thereby halving said dynamically adjusted rate at which said delay adjust signals are generated.

13. The method according to claim 12, further comprising calculating a steady-state rate at which said delay adjust signals are generated while maintaining said synchronisation of said slave and master timing and then generating said delay adjust signals at said steady-state rate.

14. The method of claim 12, wherein said predetermined number is chosen to minimize said numbers of up count signals and down count signals to an amount which is greater than zero.

15. The method according to claim 14, further comprising calculating a steady-state rate at which said delay adjust signals are generated while maintaining said synchronisation of said slave and master timing and then generating said delay adjust signals at said steady-state rate.

16. The method of claim 14, wherein said predetermined number is five.

17. The method according to claim 16, further comprising calculating a steady-state rate at which said delay adjust signals are generated while maintaining said synchronisation of said slave and master timing and then generating said delay adjust signals at said steady-state rate.

18. The method according to claim 9, further comprising calculating a steady-state rate at which said delay adjust signals are generated while maintaining said synchronisation of said slave and master timing and then generating said delay adjust signals at said steady-state rate.

* * * * *